(12) United States Patent
Shirotori

(10) Patent No.: US 11,683,886 B2
(45) Date of Patent: Jun. 20, 2023

(54) WIRING SUBSTRATE AND METHOD OF MANUFACTURING THE WIRING SUBSTRATE

(71) Applicant: SHINKO ELECTRIC INDUSTRIES CO., LTD., Nagano (JP)

(72) Inventor: Toshiki Shirotori, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 17/568,120

(22) Filed: Jan. 4, 2022

(65) Prior Publication Data

US 2022/0217844 A1 Jul. 7, 2022

(30) Foreign Application Priority Data

Jan. 7, 2021 (JP) .............................. JP2021-001672

(51) Int. Cl.
*H05K 1/11* (2006.01)
*H05K 3/42* (2006.01)

(52) U.S. Cl.
CPC .............. *H05K 1/115* (2013.01); *H05K 3/422* (2013.01); *H05K 3/423* (2013.01);
(Continued)

(58) Field of Classification Search
CPC .......... H05K 1/11; H05K 1/111; H05K 1/112; H05K 1/113; H05K 1/115; H05K 1/16; H05K 1/165; H05K 1/0296; H05K 1/0298; H05K 2201/0332; H05K 2201/0335; H05K 2201/0338; H05K 2201/03444; H05K 2201/0347; H05K 2201/08; H05K 2201/083; H05K 2201/09481; H05K 2201/095; H05K 2201/09509; H05K 2201/09518; H05K 2201/09536; H05K 2201/09545; H05K 2201/09563;
(Continued)

(56) References Cited

U.S. PATENT DOCUMENTS 6,740,411 B2  5/2004  Kojima
2007/0257761 A1  11/2007  Mano
(Continued)

FOREIGN PATENT DOCUMENTS

JP  2011216519 A  * 10/2011
JP  2019-220504     12/2019

OTHER PUBLICATIONS

JP 2011/216519 A Translation (Year: 2022).*

*Primary Examiner* — Timothy J Thompson
*Assistant Examiner* — John B Freal
(74) *Attorney, Agent, or Firm* — Rankin, Hill & Clark LLP

(57) ABSTRACT

A wiring substrate includes: a base material; a first through-hole and a second through-hole that are formed in the base material; magnetic material that is filled in the first through-hole; a third through-hole that is formed in the magnetic material; a first plating film that covers an inner wall surface of the third through-hole; and a second plating film that covers an inner wall surface of the second through-hole and the first plating film. The first plating film includes a first electroless plating film that is in contact with the inner wall surface of the third through-hole, and a first electrolytic plating film that is laminated on the first electroless plating film.

15 Claims, 12 Drawing Sheets

(52) U.S. Cl.
CPC ............... *H05K 2201/0959* (2013.01); *H05K 2201/09545* (2013.01); *H05K 2201/09563* (2013.01)

(58) Field of Classification Search
CPC ..... H05K 2201/0959; H05K 2201/086; H05K 2201/09627
See application file for complete search history.

(56) References Cited

U.S. PATENT DOCUMENTS

| | | |
|---|---|---|
| 2009/0126983 A1 | 5/2009 | Harvey et al. |
| 2009/0225525 A1 | 9/2009 | Mano |
| 2009/0294161 A1 | 12/2009 | Yoshimura |
| 2010/0117779 A1 | 5/2010 | Mano |
| 2015/0213946 A1* | 7/2015 | Mano ...................... H01F 17/04 336/200 |
| 2019/0274217 A1 | 9/2019 | Zhang |
| 2019/0385777 A1* | 12/2019 | Kodama ................. H01F 27/24 |
| 2020/0335270 A1 | 10/2020 | Kodama et al. |
| 2022/0039260 A1 | 2/2022 | Momose |
| 2022/0217844 A1 | 7/2022 | Shirotori |

\* cited by examiner

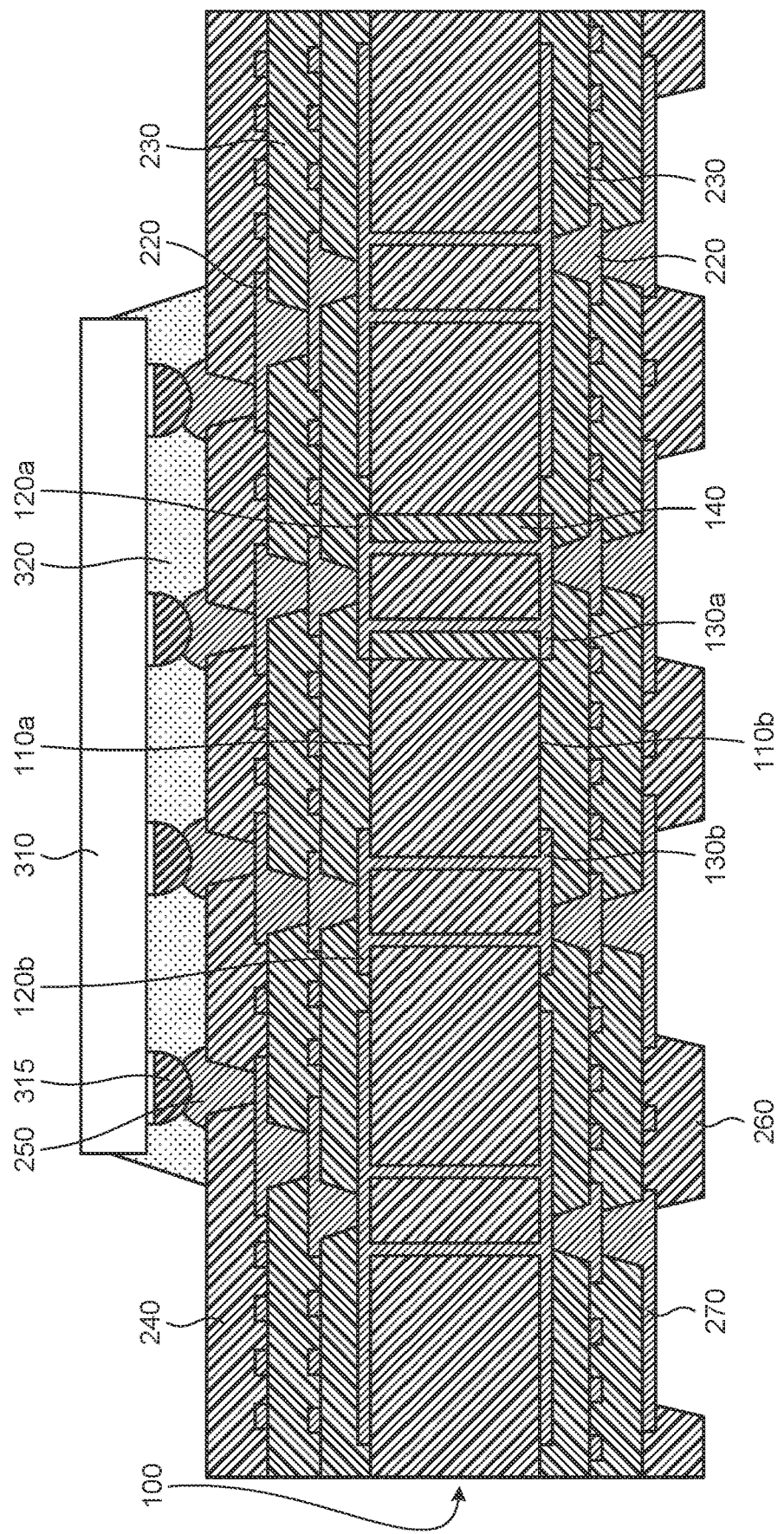

WIRING SUBSTRATE AND METHOD OF
MANUFACTURING THE WIRING
SUBSTRATE

CROSS-REFERENCE TO RELATED
APPLICATION

This application is based upon and claims the benefit of priority of the prior Japanese Patent Application No. 2021-001672, filed on Jan. 7, 2021, the entire contents of which are incorporated herein by reference.

FIELD

The embodiment discussed herein is related to a wiring substrate and a method of manufacturing the wiring substrate.

BACKGROUND

Conventionally, there is a wiring substrate having a built-in inductor formed by using a magnetic material. This type of inductor is formed by accommodating the magnetic material in a through-hole in, for example, an insulating resin layer of the wiring substrate and providing a plating film on an inner wall of a through-hole drilled in the magnetic material. In general, a process of providing the plating film on the inner wall of the through-hole in the magnetic material is performed at the same time as the plating film is provided on a surface of the wiring substrate by performing, for example electrolytic copper plating.

Patent Document 1: Japanese Laid-open Patent Publication No. 2019-220504

However, with the wiring substrate described above, there is a problem in that it is difficult to provide a plating film having a sufficient film thickness on the inner wall of the through-hole in the magnetic material and the electric characteristics of the inductor is not accordingly improved. Specifically, in a process of providing the plating film, an electrolytic plating solution is less likely to flow in the through-hole in the magnetic material as compared to the surface of the wiring substrate, so that the electrolytic plating film is hardly deposited. As a result, the thickness of the plating film provided on the through-hole inner wall of the magnetic material tends to be thinner than the thickness of the plating film provided on the surface of the wiring substrate. Furthermore, if the plating film on the inner wall of the through-hole in the magnetic material is thin, the electric resistance of the plating film is not sufficiently decreased, the improvement of the electric characteristics as the inductor is limited.

Furthermore, in order to thicken the plating film of the through-hole inner wall of the magnetic material, if a period of time for which electrolytic plating is performed is extended or if a current value used by electrolytic plating is increased, the thickness of the plating film of the through-hole inner wall of the magnetic material is increased and, at the same time, the thickness of the plating film of the surface of the wiring substrate is also increased. If the thickness of the plating film is increased more than necessary on the wiring substrate surface, it is difficult to form a minute high-density wiring layer on the wiring substrate surface. Therefore, it is not preferable to thicken the plating film of the through-hole inner wall of the magnetic material by extending the period of time for which electrolytic plating is performed or increasing the current value without careful consideration.

SUMMARY

According to an aspect of an embodiment, a wiring substrate includes: a base material; a first through-hole and a second through-hole that are formed in the base material; a magnetic material that is filled in the first through-hole; a third through-hole that is formed in the magnetic material; a first plating film that covers an inner wall surface of the third through-hole; and a second plating film that covers an inner wall surface of the second through-hole and the first plating film. The first plating film includes a first electroless plating film that is in contact with the inner wall surface of the third through-hole, and a first electrolytic plating film that is laminated on the first electroless plating film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 20 is a diagram illustrating a configuration example of a semiconductor device.

DESCRIPTION OF EMBODIMENTS

Preferred embodiments of a wiring substrate and method of manufacturing the wiring substrate disclosed in the present invention will be explained in detail below with reference to the accompanying drawings. Furthermore, the present invention is not limited to the embodiments.

Figure 1:
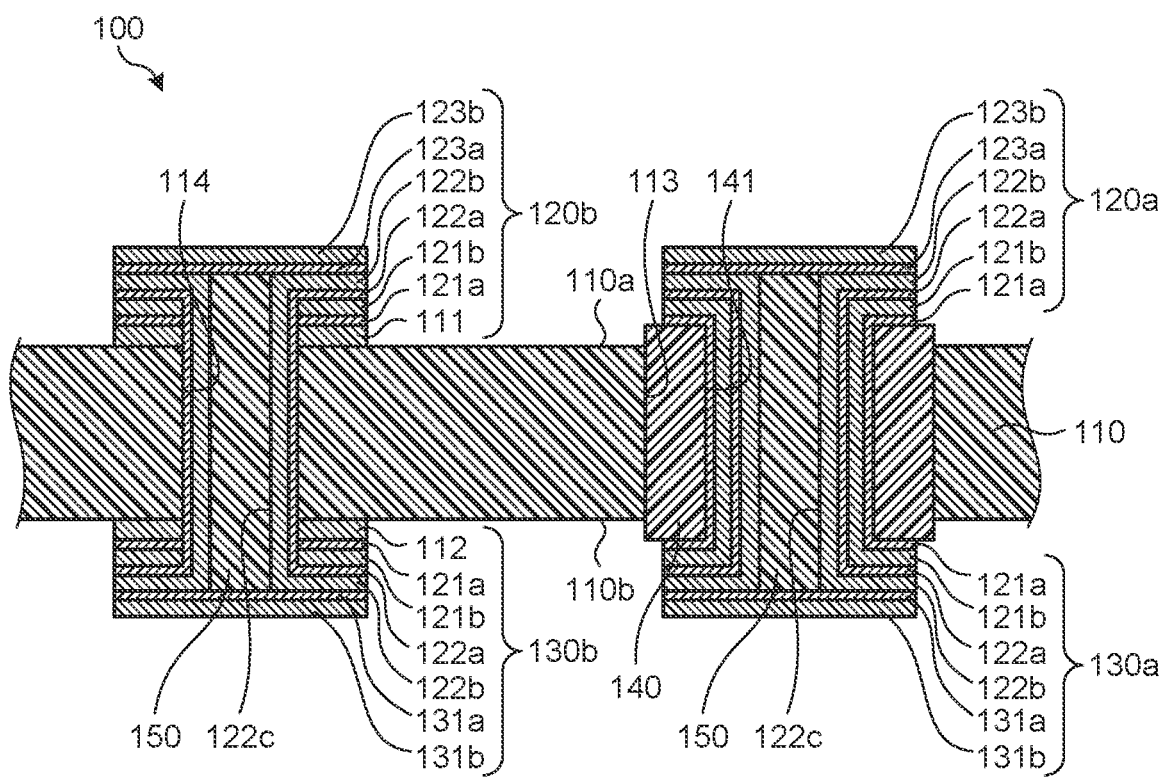
FIG. 1 is a partial sectional view illustrating a core substrate according to one embodiment.

FIG. 1 is a partial sectional view illustrating configuration of a core substrate 100 included in a multi-layer wiring substrate according to one embodiment. As illustrated in FIG. 1, the core substrate 100 is a wiring substrate having a base material 110, wiring layers 120a and 120b, wiring layers 130a and 130b, a magnetic material 140, and an insulating resin 150. Furthermore, in the following, a description will be made by assuming that the side of one of the surfaces of the base material 110 on which the wiring layers 120a and 120b are formed is an upper side and is referred to as an upper surface 110a, whereas the side of the other of the surfaces of the base material 110 on which the wiring layers 130a and 130b are formed is a lower side and is referred to as a lower surface 110b. However, the core substrate 100 may be used by, for example, vertically inverting the surfaces.

The base material 110 is a base material of the core substrate 100 and is configured to include a plate-shaped member having insulation properties. The base material 110 used may be, for example, a glass epoxy substrate or the like obtained by impregnating a glass cloth with an insulation-property resin, such as an epoxy-based resin or a polyimide-based resin. Furthermore, the base material 110 used may also be a substrate obtained by impregnating a woven fabric or a non-woven fabric made from glass fibers, a carbon fibers, aramid fibers, or the like with an epoxy-based resin. The thickness of the base material 110 may be about, for example, 400 to 1200 μm.

The wiring layers 120a and 120b are formed on the upper surface 110a of the base material 110, whereas the wiring layers 130a and 130fc are formed on the lower surface 110b of the base material 110. Furthermore, a metal foil 111 included in the wiring layer 120b is a metal foil that is previously provided on the upper surface 110a of the base material 110 and that can be removed by performing etching. Similarly, a metal foil 112 included in the wiring layer 130b is a metal foil that is previously provided on the lower surface 110b of the base material 110 and that can be removed by performing etching. Examples of the metal foils 111 and 112 used here include a copper foil, a copper alloy foil, or the like. The thickness of each of the metal foils 111 and 112 is, for example, 4 to 7 μm.

In the base material 110, through-holes 113 and 114 passing through the base material 110 in the thickness direction are drilled. The through-hole 113 is a through-hole formed in a cylindrical shape having an opening portion with a diameter of about, for example, 300 to 400 μm, and accommodates therein the magnetic material 140. Furthermore, the through-hole 114 is a through-hole formed in a cylindrical shape having an opening portion with a diameter of about, for example, 100 to 200 μm, and accommodated therein the insulating resin 150.

The wiring layer 120a has a plurality of electroless plating films and electrolytic plating films, and forms a pad on the upper surface of the magnetic material 140. Specifically, the wiring layer 120a includes a first electroless plating film 121a, a first electrolytic plating film 121b, a second electroless plating film 122a, a second electrolytic plating film 122b, a third electroless plating film 123a, and a third electrolytic plating film 123b.

In contrast, the wiring layer 120b includes a plurality of electroless plating films and electrolytic plating films, and forms a pad on the upper surface 110a of the base material 110. Specifically, the wiring layer 120b includes the metal foil 111, the first electroless plating film 121a, the first electrolytic plating film 121b, the second electroless plating film 122a, the second electrolytic plating film 122b, the third electroless plating film 123a, and the third electrolytic plating film 123b.

Namely, the wiring layer 120b has a configuration in which the metal foil 111 that is previously provided on the upper surface 110a of the base material 110 is added onto the lowermost layer of the wiring layer 120a. The electroless plating films 121a, 122a, and 123a constituting the wiring layers 120a and 120b are electroless plating films that are simultaneously formed by performing electroless plating. Furthermore, the electrolytic plating films 121b, 122b, and 123b constituting the wiring layers 120a and 120b are electrolytic plating films that are simultaneously formed by performing electrolytic plating.

The wiring layer 130a includes a plurality of electroless plating films and electrolytic plating films, and forms a pad on the lower surface of the magnetic material 140. Specifically, the wiring layer 130a includes the first electroless plating film 121a, the first electrolytic plating film 121b, the second electroless plating film 122a, the second electrolytic plating film 122b, a fourth electroless plating film 131a, and a fourth electrolytic plating film 131b.

In contrast, the wiring layer 130b includes a plurality of electroless plating films and electrolytic plating films, and forms a pad on the lower surface 110b of the base material 110. Specifically, the wiring layer 130b includes the metal foil 112, the first electroless plating film 121a, the first electrolytic plating film 121b, the second electroless plating film 122a, the second electrolytic plating film 122b, the fourth electroless plating film 131a, and the fourth electrolytic plating film 131b.

Namely, the wiring layer 130b has a configuration in which the metal foil 112 that is previously provided on the lower surface 110b of the base material 110 is added onto the uppermost layer of the wiring layer 130a. The electroless plating films 121a, 122a, and 131a constituting the wiring layers 130a and 130b are electroless plating films that are simultaneously formed by performing electroless plating. Furthermore, the electrolytic plating films 121b, 122b, and 131b constituting the wiring layers 130a and 130b are electrolytic plating films that are simultaneously formed by performing electrolytic plating.

The magnetic material 140 is filled in the through-hole 113 that is formed in the base material 110, an upper end portion protrudes from the upper surface 110a of the base material 110, and a lower end portion protrude from the lower surface 110b of the base material 110. Specifically, the upper end portion of the magnetic material 140 protrudes from the upper surface 110a of the base material 110 by an amount substantially similar to the thickness of the metal foil 111, and the lower end portion of the magnetic material 140 protrudes from the lower surface 110b of the base material 110 by an amount substantially similar to the thickness of the metal foil 112. The magnetic material 140 used may be, for example, an insulation-property resin, such as an epoxy-based resin, having magnetic particles. Examples of the magnetic particles includes a filler, such as iron, iron oxide, cobalt iron oxide, ferrosilicon, magnetic alloy, or ferrite.

At the center of the magnetic material 140 in a plan view, a through-hole 141 passing through the magnetic material 140 in the thickness direction of the base material 110 is drilled. The through-hole 141 is a through-hole formed in a cylindrical shape having an opening portion with a diameter of about, for example, 100 to 200 μm, and accommodates therein the insulating resin 150. On the inner wall surface of the through-hole 141, the first electroless plating film 121a, the first electrolytic plating film 121b, the second electroless plating film 122a, and the second electrolytic plating film 122b continued from the wiring layer 120a and the wiring layer 130a are laminated in this order. The magnetic material 140 and the electroless plating films and the electrolytic plating films inside the through-hole 141 form an inductor. A through-hole 122c is formed on the inner side of the second electrolytic plating film 122b that is the innermost layer of the through-hole 141, and the insulating resin 150 is filled into the through-hole 122c.

In contrast, on the inner wall surface of the through-hole 114 formed in the base material 110, the second electroless plating film 122a and the second electrolytic plating film 122b continued from the wiring layer 120b and the wiring layer 130b are laminated in this order. Then, the through-hole 122c is formed on the inner side of the second electrolytic plating film 122b that is the innermost layer of the through-hole 114, and the insulating resin 150 is filled into the through-hole 122c.

In this way, on the inner wall surface of the through-hole 141 in the magnetic material 140, the plating film that is thicker than that of the inner wall surface of the through-hole 114 by an amount corresponding to the first electroless plating film 121a and the first electrolytic plating film 121b is formed. Consequently, it is possible to reduce electric resistance in the electroless plating film and the electrolytic plating film inside the through-hole 141 in the magnetic material 140, and it is thus possible to improve the electric characteristics of the inductor embedded in the core substrate 100.

In the following, each of the electroless plating films and the electrolytic plating films will be described.

The first electroless plating film 121a is formed on the surface of the magnetic material 140 and the surface of the metal foils 111 and 112. Namely, in the vicinity of the magnetic material 140, the first electroless plating film 121a is continuously formed so as to in contact with the upper surface of the magnetic material 140, the inner wall surface of the through-hole 141, and the lower surface of the magnetic material 140. In contrast, in the vicinity of the through-hole 114, the first electroless plating film 121a is laminated on the upper surface of the metal foil 111 and the lower surface of the metal foil 112. The thickness of the first electroless plating film 121a is about, for example, 0.4 to 0.6 µm.

The first electrolytic plating film 121b is laminated on the first electroless plating film 121a. Namely, in the vicinity of the magnetic material 140, the first electrolytic plating film 121b continuously laminated on the first electroless plating film 121a on the upper side of the magnetic material 140, inside the through-hole 141, and on the lower side of the magnetic material 140. In contrast, in the vicinity of the through-hole 114, the first electrolytic plating film 121b is laminated on the upper surface or the lower surface of the first electroless plating film 121a. The thickness of the first electrolytic plating film 121fc is about for example, 8 to 12 µm on the surface of the core substrate 100, and is about, for example, 5 to 7 µm inside the through-hole 141. Namely, the electrolytic plating solution is less likely to circulate in the interior of the through-hole 141; therefore, the first electrolytic plating film 121b inside each of the through-hole 141 is thinner than the surface of the core substrate 100.

The first electrolytic plating film 121b is laminated on the first electroless plating film 121a inside the through-hole 141 in the magnetic material 140. Accordingly, the first electrolytic plating film 121b is formed on the surface of the first electroless plating film 121a having conductivity, so that the first electrolytic plating film 121b is able to obtain a uniform thickness inside the through-hole 141. Specifically, the magnetic material 140 is formed of an insulation-property resin, such as an epoxy-based resin, containing magnetic particles; therefore, on the surface of the magnetic material 140, the magnetic particles having conductivity and the insulation-property resin without having conductivity are exposed. Then, in a case where electrolytic plating is directly applied to the surface of this type of the magnetic material 140, the electrolytic plating film is not deposited at the portion in which the insulation-property resin is exposed. Thus, although an electrolytic plating film is deposited to some extent at the portion in which the magnetic particles are exposed, a portion in which the electrolytic plating film is not formed is generated over the entire surface of the magnetic material 140, so that an electrolytic plating film having an insufficient and non-uniform film thickness is formed.

In contrast, as a result of the first electroless plating film 121a being formed on the surface of the magnetic material 140, the surface on which the first electrolytic plating film 121b is formed has sufficient conductivity, and thus, a sufficient and uniform electrolytic plating film is deposited over the entire surface of the magnetic material 140. Because the first electrolytic plating film 121b is formed in this way, the surface of the magnetic material 140 including inside the through-hole 141 is covered by the satisfactory first electrolytic plating film 121b, and electrical continuity inside the through-hole 141 is ensured. As a result, it is possible to improve the electric characteristics of the inductor that is formed by using the magnetic material 140.

The second electroless plating film 122a is laminated on the first electrolytic plating film 121b and is formed not only inside the through-hole 141 of the magnetic material 140 but also inside the through-hole 114. Namely, in the vicinity of the magnetic material 140, the second electroless plating film 122a is continuously laminated on the first electrolytic plating film 121b on the upper side of the magnetic material 140, inside the through-hole 141, and on the lower side of the magnetic material 140. In contrast, in the vicinity of the through-hole 114, the second electroless plating film 122a is laminated on the upper surface or the lower surface of the first electrolytic plating film 121b, is also formed on the inner wall surface of the through-hole 114, and is continuously formed on the upper side of the metal foil 111, inside the through-hole 114, and on the lower side of metal foil 112. The thickness of the second electroless plating film 122a is about, for example, 0.4 to 0.6 µm.

The second electrolytic plating film 122b is laminated on the second electroless plating film 122a. Namely, in the vicinity of the magnetic material 140, the second electrolytic plating film 122b is continuously laminated on the second electroless plating film 122a on the upper side of the magnetic material 140, inside the through-hole 141, and on the lower side of the magnetic material 140. In contrast, in the vicinity of the through-hole 114, the second electrolytic plating film 122b is continuously laminated on the second electroless plating film 122a on the upper side of the metal foil 111, inside the through-hole 114, and on the lower side of the metal foil 112. The thickness of the second electrolytic plating film 122b is about, for example, 18 to 22 µm on the surface of the core substrate 100, and is about, for example, 16 to 20 µm inside the through-hole 141 and inside the through-hole 114. Namely, the electrolytic plating solution is less likely to circulate in the interior of the through-hole 141 and the through-hole 114; therefore, the second electrolytic plating film 122b inside each of the through-hole 141 and the through-hole 114 is thinner than the surface of the core substrate 100.

Furthermore, the second electrolytic plating film 122b is thicker than the first electrolytic plating film 121b. Consequently, even if an end portion of, for example, a glass cloth contained in the base material 110 protrudes on the inner wall surface of the through-hole 114, the protruding portion is embedded by the second electrolytic plating film 122b that is relatively thick. As a result, it is possible to ensure electrical continuity inside the through-hole 114, and also, it is possible to improve the filling property of the insulating resin 150 with respect to the through-hole 122c formed by the second electrolytic plating film 122b. Furthermore, the first electrolytic plating film 121b inside the through-hole 141 in the magnetic material 140 is not excessively thickened, so that it is possible to suppress a variation in thickness of the first electrolytic plating film 121b and improve the electric characteristics of the inductor by ensuring uniform conductivity. Furthermore, inside the through-hole 141 in the magnetic material 140, the second electrolytic plating film 122b is laminated on the second electroless plating film 122a, the first electroless plating film 121a, and the first electrolytic plating film 121b, so that the surface of the second electrolytic plating film 122b is formed to have sufficient conductivity, and thus, the variation in thickness of the second electrolytic plating film 122b is suppressed.

The third electroless plating film 123a is laminated on the second electrolytic plating film 122b in the wiring layers 120a and 120b, and is formed on the upper surface of the insulating resin 150. Namely, the third electroless plating film 123a is laminated, in a planar state, on the upper side of the wiring layers 120a and 120b that are formed on the upper surface 110a of the base material 110. The thickness of the third electroless plating film 123a is about, for example, 0.4 to 0.6 µm.

The third electrolytic plating film 123b is laminated on the third electroless plating film 123a. Namely, the third electrolytic plating film 123b is laminated, in a planar state, on the uppermost layer of the wiring layers 120a and 120fc that are formed on the upper surface 110a of the base material 110. The thickness of the third electrolytic plating film 123b is about, for example, 13 to 17 µm.

The third electrolytic plating film 123b is thicker than the first electrolytic plating film 121b and is thinner than the second electrolytic plating film 122b. Because the third electrolytic plating film 123b is thicker than the first electrolytic plating film 121b, the upper surface of the insulating resin 150 is covered by a sufficient strength, and thus, it is possible to prevent protrusion of the insulating resin 150 caused by a difference in coefficient of thermal expansion with the base material 110. As a result, it is possible to ensure electrical connectivity of the upper surface of the wiring layers 120a and 120b. Furthermore, because the third electrolytic plating film 123b is thinner than the second electrolytic plating film 122b, the third electrolytic plating film 123b is not excessively thick, and thus, miniaturization and densification of the wiring layers 120a and 120b are not prevented.

The fourth electroless plating film 131a is laminated on the second electrolytic plating film 122b in the wiring layers 130a and 130b, and is formed on the lower surface of the insulating resin 150. Namely, the fourth electroless plating film 131a is laminated, in a planar state, on the lower side of the wiring layers 130a and 130b that are formed on the lower surface 110b of the base material 110. The thickness of the fourth electroless plating film 131a is about, for example, 0.4 to 0.6 µm.

The fourth electrolytic plating film 131b is laminated on the fourth electroless plating film 131a. Namely, the fourth electrolytic plating film 131b is laminated, in a planar state, on the lowermost layer of the wiring layers 130a and 130b that are formed on the lower surface 110b of the base material 110. The thickness of the fourth electrolytic plating film 131b is about, for example, 13 to 17 µm.

Similarly to the third electrolytic plating film 123b, the fourth electrolytic plating film 131b is thicker than the first electrolytic plating film 121b, and is thinner than the second electrolytic plating film 122b. Because the fourth electrolytic plating film 131b is thicker than the first electrolytic plating film 121b the lower surface of the insulating resin 150 is covered by a sufficient strength, and thus, it is possible to prevent protrusion of the insulating resin 150 caused by a difference in coefficient of thermal expansion with the base material 110. As a result, it is possible to ensure electrical connectivity of the lower surface of the wiring layers 130a and 130b. Furthermore, because the fourth electrolytic plating film 131b is thinner than the second electrolytic plating film 122b, the fourth electrolytic plating film 131b is not excessively thick, and thus, miniaturization and densification of the wiring layers 130a and 130b are not prevented.

Figure 2:
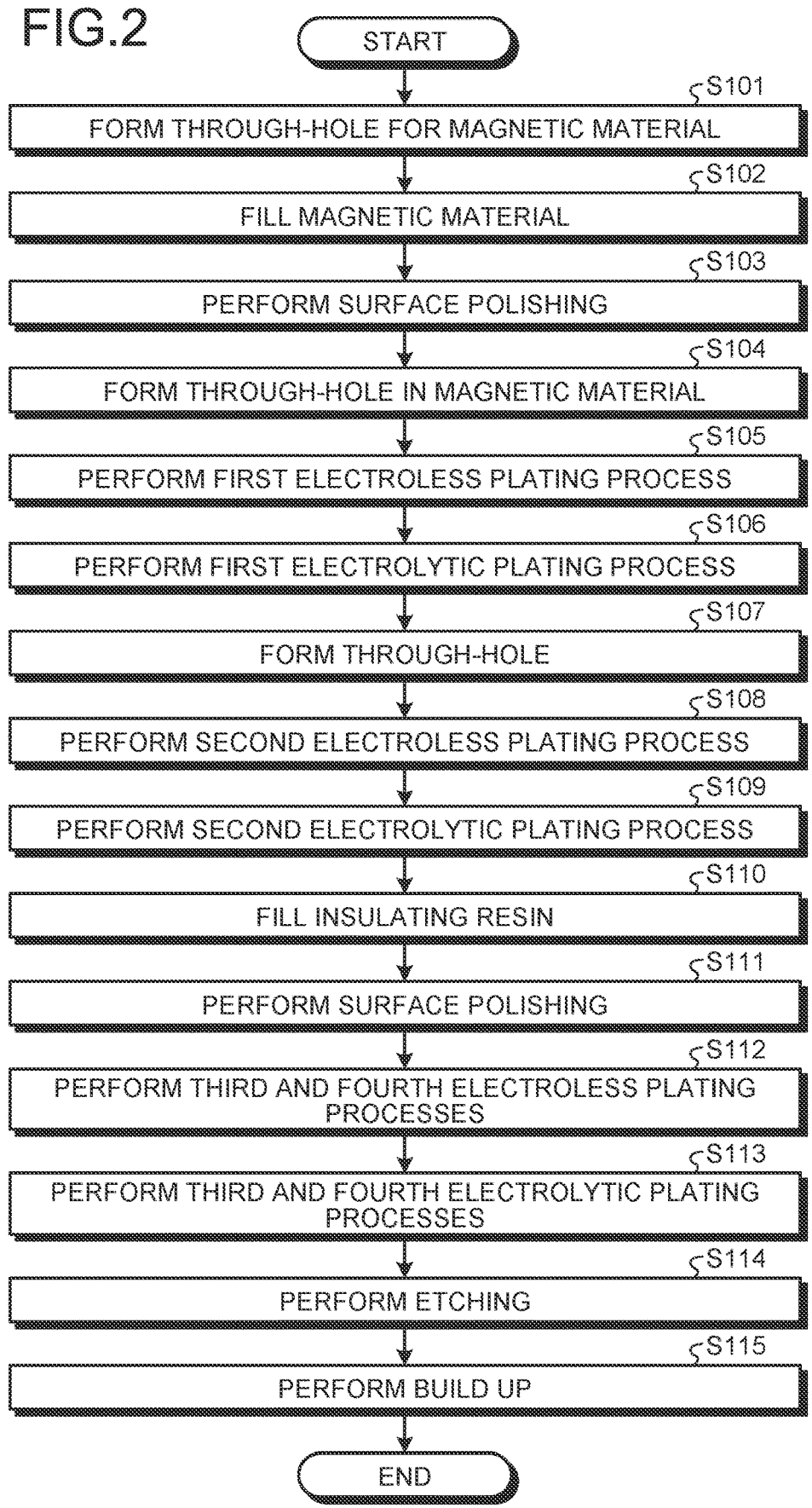
FIG. 2 is a flowchart illustrating a method of manufacturing a multi-layer wiring substrate according to one embodiment.

In the following, a manufacturing method of the multilayer wiring substrate including the core substrate 100 having configuration described above will be specifically described using examples with reference to the flowchart illustrated in FIG. 2.

Figure 3:
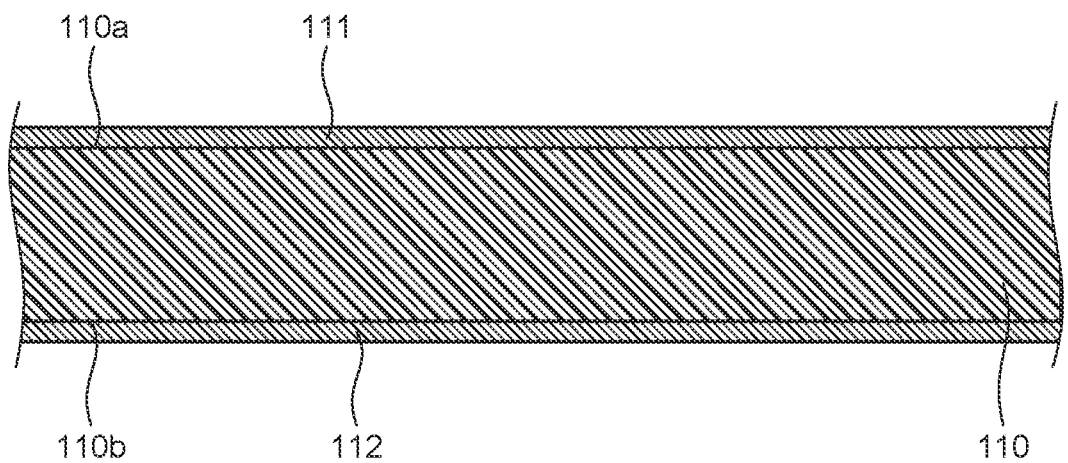
FIG. 3 is a diagram illustrating a configuration of a base material.
Figure 4:
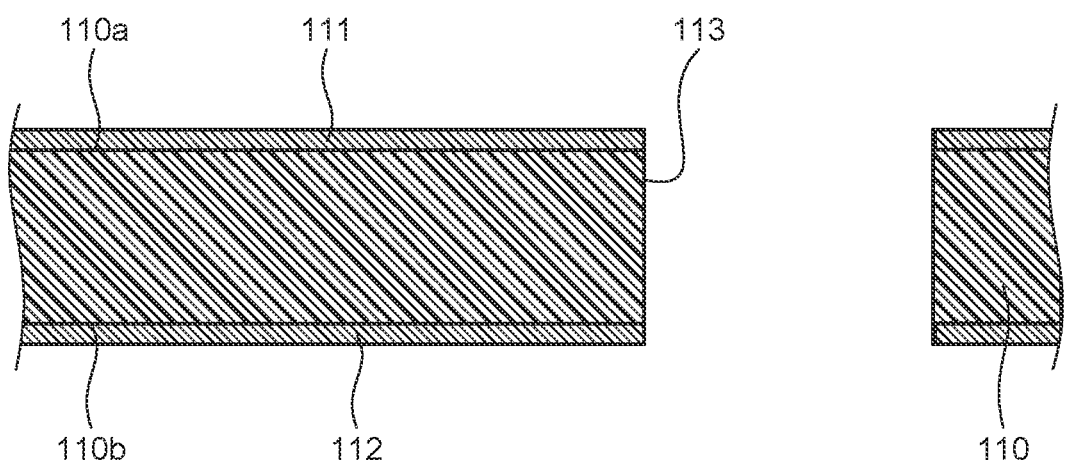
FIG. 4 is a diagram illustrating a specific example of a through-hole formation process.

First, the through-hole 113 through which the magnetic material 140 is filled is formed in the base material 110 that is configured to have a plate-shaped member having insulation properties (Step S101). On the base material 110, for example, as illustrated in FIG. 3, the metal foil 111 is formed on the upper surface 110a that is the plate-shaped member having insulation properties, and the metal foil 112 is formed on the lower surface 110b. The thickness of the base material 110 is about, for example, 400 to 1200 µm. On the base material 110, for example, as illustrated in FIG. 4, the through-hole 113 having a cylindrical shape with the diameter of the opening portion thereof being about 300 to 400 µm is formed. The through-hole 113 is formed by performing, for example, laser beam machining or drilling, and, after the through-hole 113 is formed, a desmear process of removing a resin residue remaining on the inner wall surface is performed. For the desmear process, for example, a potassium permanganate solution may be used.

Figure 5:
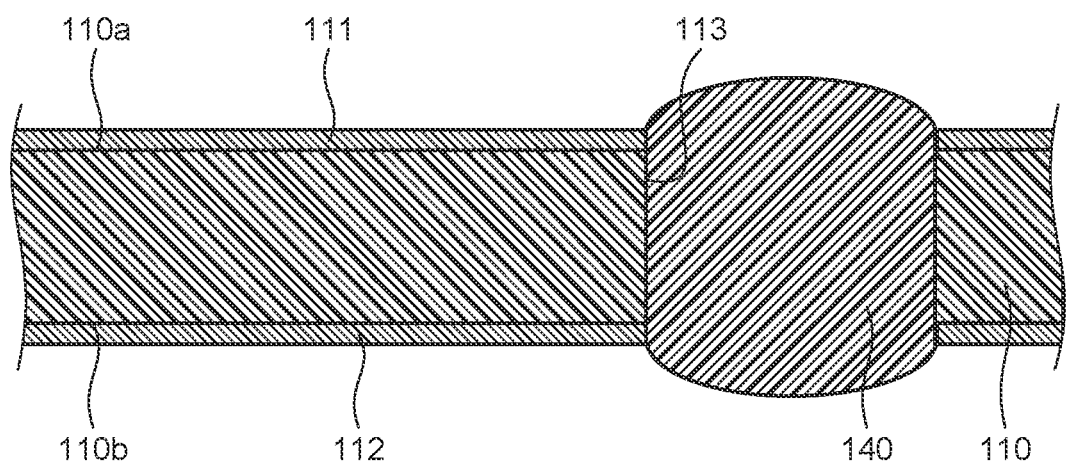
FIG. 5 is a diagram illustrating a specific example of a magnetic material filling formation process.

Then, the magnetic material 140 is filled in the through-hole 113 (Step S102). Namely, for example, as illustrated in FIG. 5, the magnetic material 140 that is formed of insulation-property resin containing magnetic particles is filled in the through-hole 113 that is formed in the base material 110. The magnetic material 140 is filled in the through-hole 113 without any gap, so that the upper end portion upwardly protrudes from the metal foil 111 provided on the base material 110, and the lower end portion downwardly protrudes from the metal foil 112 provided on the base material 110.

Figure 6:
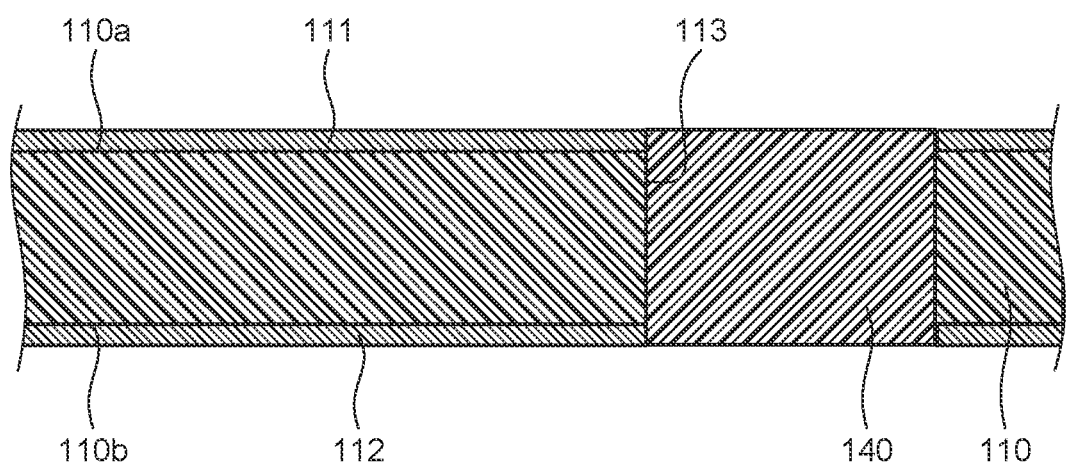
FIG. 6 is a diagram illustrating a specific example of a surface polishing process.

Thus, surface polishing is performed on the protruding portions such that the upper end portion and the lower end portion of the magnetic material 140 are flush with the surface of the metal foils 111 and 112 (Step S103). Namely, for example FIG. 6, the upper end portion of the magnetic material 140 is ground such that the upper surface of the metal foil 111 and the upper surface of the magnetic material 140 are flush with each other, and the lower end portion of the magnetic material 140 is ground such that the lower surface of the metal foil 112 and the lower surface of the magnetic material 140 are flush with each other.

Figure 7:
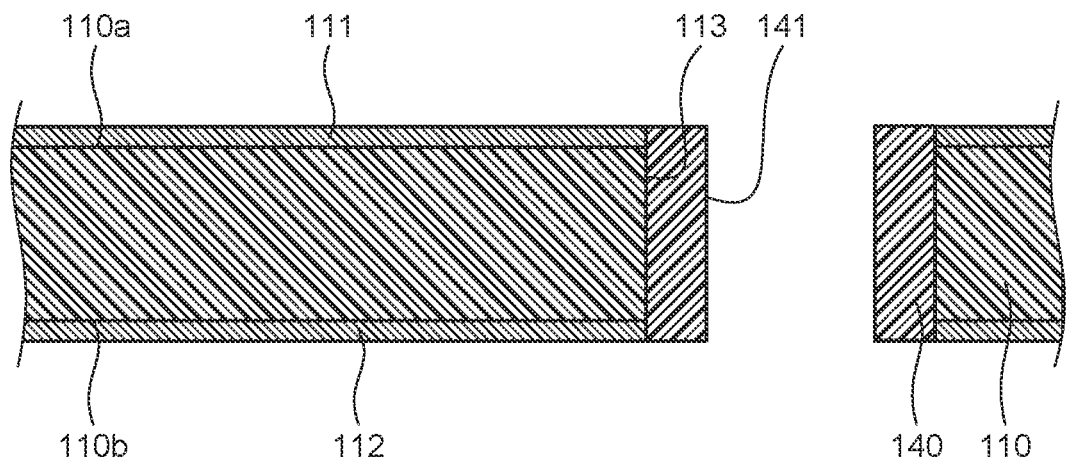
FIG. 7 is a diagram illustrating a specific example of the through-hole formation process.

When the upper surface and the lower surface of the magnetic material 140 are ground to be plane surfaces, the through-hole 141 passing through the magnetic material 140 in the thickness direction of the base material 110 is formed (Step S104). The through-hole 141 is formed, for example, as illustrated in FIG. 7, at the center of the magnetic material 140 in a planar view, and has a cylindrical shape with the diameter of the opening portion being about 100 to 200 µm. The through-hole 141 is formed by performing, for example, laser beam machining or drilling, and, after the through-hole 141 is formed, the inner wall surface is washed with water in order to remove the residue.

Figure 8:
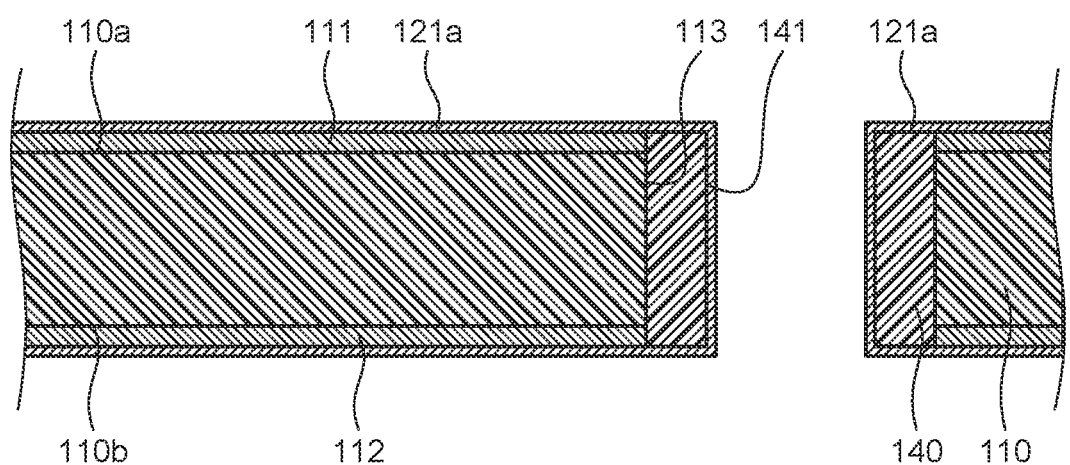
FIG. 8 is a diagram illustrating a specific example of a first electroless copper plating process.

After the through-hole 141 is formed in the magnetic material 140, the first electroless plating film 121a that covers a portion exposed on the surface is formed (Step S105). Specifically, for example, as illustrated in FIG. 8, for example, electroless copper plating is performed on the upper surface of the metal foil 111, the upper surface of the magnetic material 140, the inner wall surface of the through-hole 141, the lower surface of the magnetic material 140, and the lower surface of the metal foil 112, so that the first electroless plating film 121a is formed. Here, because electroless copper plating is performed, even if the insulation-property resin that does not have conductivity is exposed to the upper surface and the lower surface of the magnetic material 140 or the inner wall surface of the through-hole 141, the first electroless plating film 121a is reliably formed. The thickness of the first electroless plating film 121a is about, for example, 0.4 to 0.6 µm.

Figure 9:
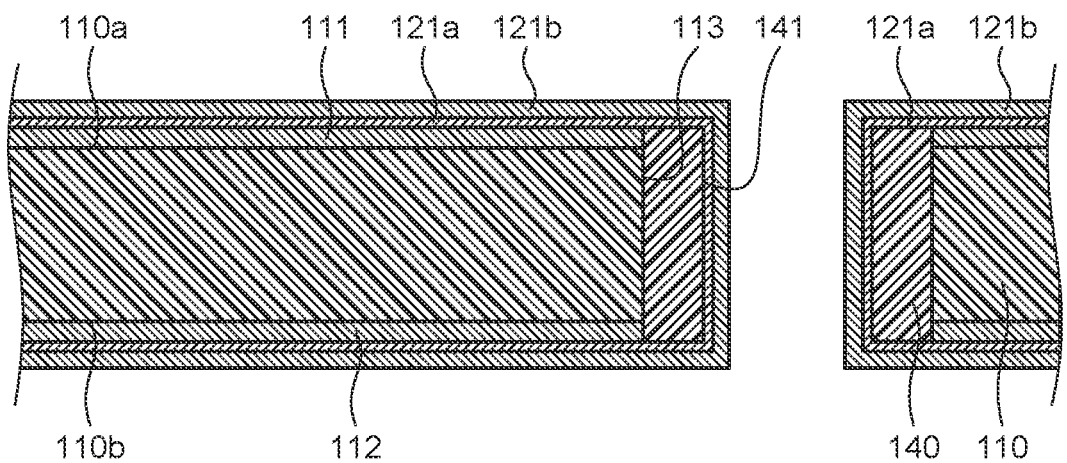
FIG. 9 is a diagram illustrating a specific example of the first electrolytic copper plating process.
Figure 10:
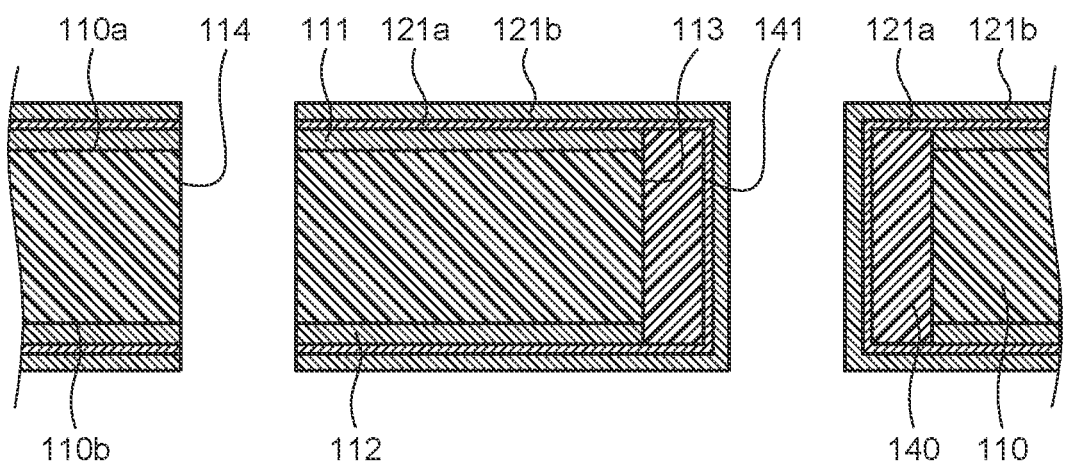
FIG. 10 is a diagram illustrating a specific example of the through-hole formation process.

Then, the first electrolytic plating film 121b is laminated on the first electroless plating film 121a (Step S106). Namely, for example, as illustrated in FIG. 9, the first electrolytic plating film 121b is formed by performing, for example, electrolytic copper plating on the surface on which the first electroless plating film 121a is formed. Here, because electrolytic copper plating is performed on the surface of the first electroless plating film 121a that has conductivity, the electrolytic plating film is also sufficiently deposited inside the through-hole 141 in the magnetic material 140, the first electrolytic plating film 121b having a sufficient film thickness is formed. The thickness of the first electrolytic plating film 121b is about, for example, 8 to 12 µm at a portion other than inside the through-hole 141, and is about, for example, 5 to 7 µm inside the through-hole 141.

When the first electrolytic plating film 121b is formed, the through-hole 114 that passes through the base material 110 is formed at the position that does not overlap with the magnetic material 140 (Step S107). Specifically, at the position that does not overlap with the magnetic material 140, the through-hole 114 that passes through, in addition to the base material 110, the metal foils 111 and 112 provided on the upper and the lower surfaces of the base material 110, the first electroless plating film 121a, and the first electrolytic plating film 121b is formed. Similarly to the through-hole 141 in the magnetic material 140, the through-hole 114 has a cylindrical shape with the diameter of the opening portion thereof being about 100 to 200 µm. The through-hole 114 is formed by performing, for example, laser beam machining or drilling, and, after the through-hole 114 is formed, a desmear process of removing a resin residue remaining on the inner wall surface is performed. For the desmear process, for example, a potassium permanganate solution may be used. An alkaline solution, such as a potassium permanganate solution, used for the desmear process may possibly take away the magnetic particles; however, here, because the magnetic material 140 is covered by the first electroless plating film 121a and the first electrolytic plating film 121b, the magnetic particles are not taken away from the magnetic material 140.

Figure 11:
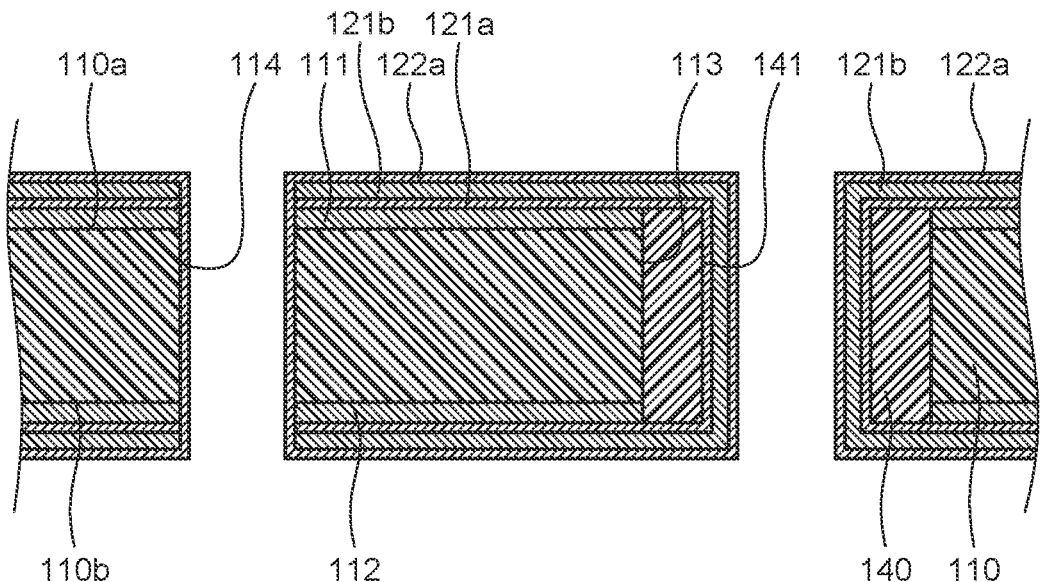
FIG. 11 is a diagram illustrating a specific example of a second electroless copper plating process.

After the through-hole 114 is formed, the second electroless plating film 122a that covers the portion that is exposed to the surface is formed (Step S108). Specifically, for example, as illustrated in FIG. 11, for example, electroless copper plating is performed on the surface on which the first electrolytic plating film 121b is formed and is performed on the inner wall surface of the through-hole 114, so that the second electroless plating film 122a is formed. Here, because electroless copper plating is performed, the second electroless plating film 122a is also reliably performed on the inner wall surface of the through-hole 114 on which the base material 110 having the insulation properties is exposed. The thickness of the second electroless plating film 122a is about, for example, 0.4 to 0.6 µm.

Figure 12:
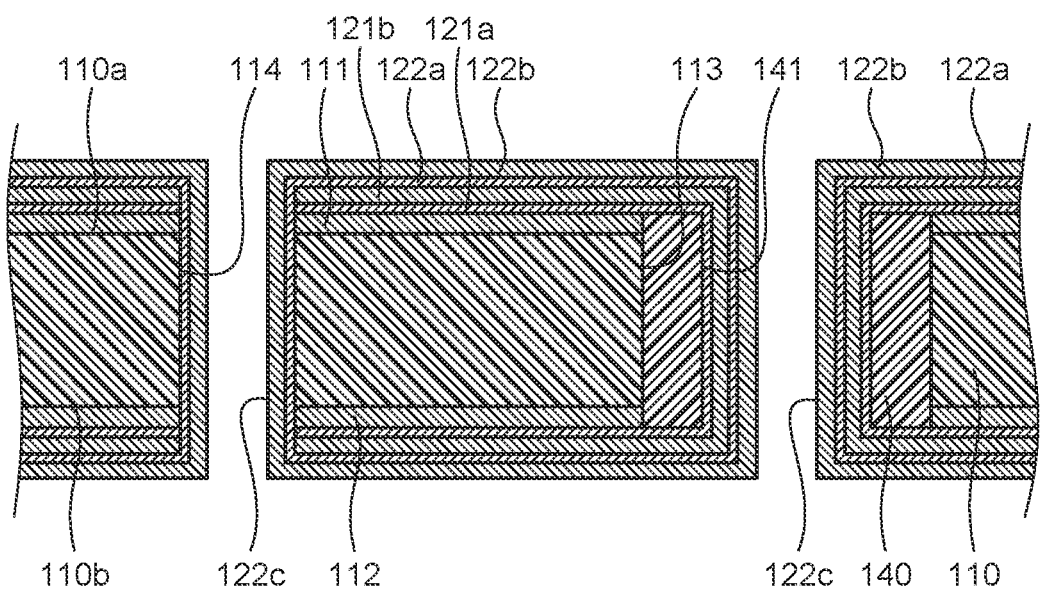
FIG. 12 is a diagram illustrating a specific example of the second electrolytic copper plating process.

Then, the second electrolytic plating film 122b is laminated on the second electroless plating film 122a (Step S109). Namely, for example, as illustrated in FIG. 12, for example, electrolytic copper plating is performed on the surface on which the second electroless plating film 122a is formed, so that the second electrolytic plating film 122b is formed. Consequently, on the inner wall surface of the through-hole 114, the second electroless plating film 122a and the second electrolytic plating film 122b are formed. In contrast, on the inner wall surface of the through-hole 141 in the magnetic material 140, in addition to the second electroless plating film 122a and the second electrolytic plating film 122b, the first electroless plating film 121a and the first electrolytic plating film 121b are formed. Namely, inside the through-hole 141 in the magnetic material 140, as compared to inside the through-hole 114, the plating film having conductivity is thickly formed.

The thickness of the second electrolytic plating film 122b is about, for example, 16 to 22 µm at the portion other than the through-hole 114 and the through-hole 141, and is about, for example, 16 to 20 µm inside the through-hole 114 and the through-hole 141. Therefore, a plating film having conductivity with a film thickness of about at least 21 to 27 µm is formed inside the through-hole 141 in the magnetic material 140, and it is thus possible to sufficiently reduce the electric resistance in the subject plating film. As a result, it is possible to improve the electric characteristics of the inductor formed by the magnetic material 140 and the plating film inside the through-hole 141.

Figure 13:
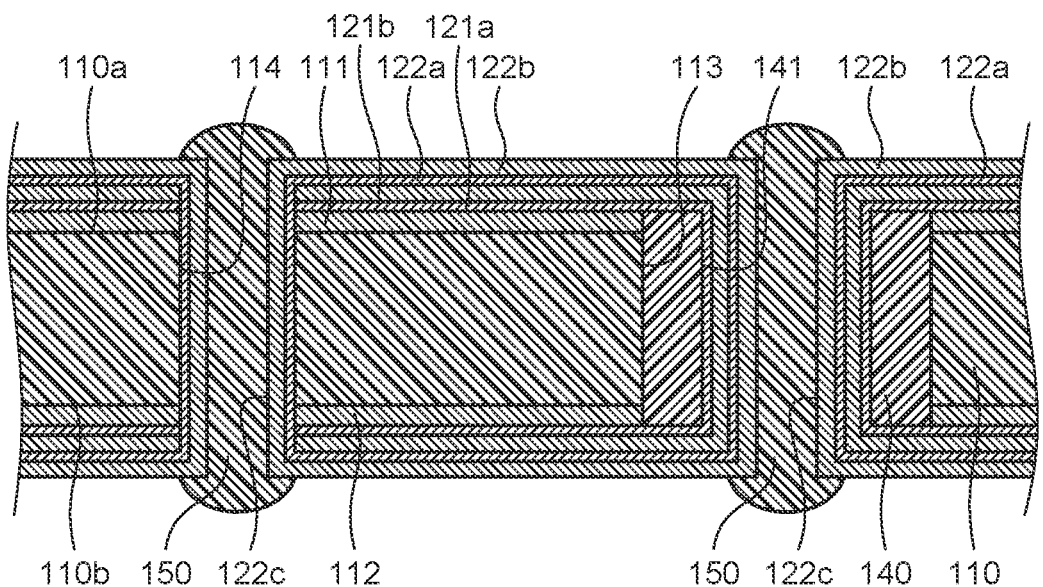
FIG. 13 is a diagram illustrating a specific example of an insulating resin filling process.

As a result of the second electrolytic plating film 122b being formed, the through-hole 122c is formed inside each of the through-hole 114 and the through-hole 141 by the second electrolytic plating film 122b. Then, the insulating resin 150 is filled in the through-hole 122c (Step S110). Namely, for example, as illustrated in FIG. 13, the insulating resin 150 is filled in the through-hole 122c that is formed inside each of the through-hole 114 and the through-hole 141. The insulating resin 150 used may be, for example, an epoxy-based resin containing filler, such as silica. The insulating resin 150 is filled without any gap, so that the upper end portion upwardly protrudes from the opening portion located on the upper side of the through-hole 122c, and the lower end portion downwardly protrudes from the opening portion located on the lower side of the through-hole 122c.

Figure 14:
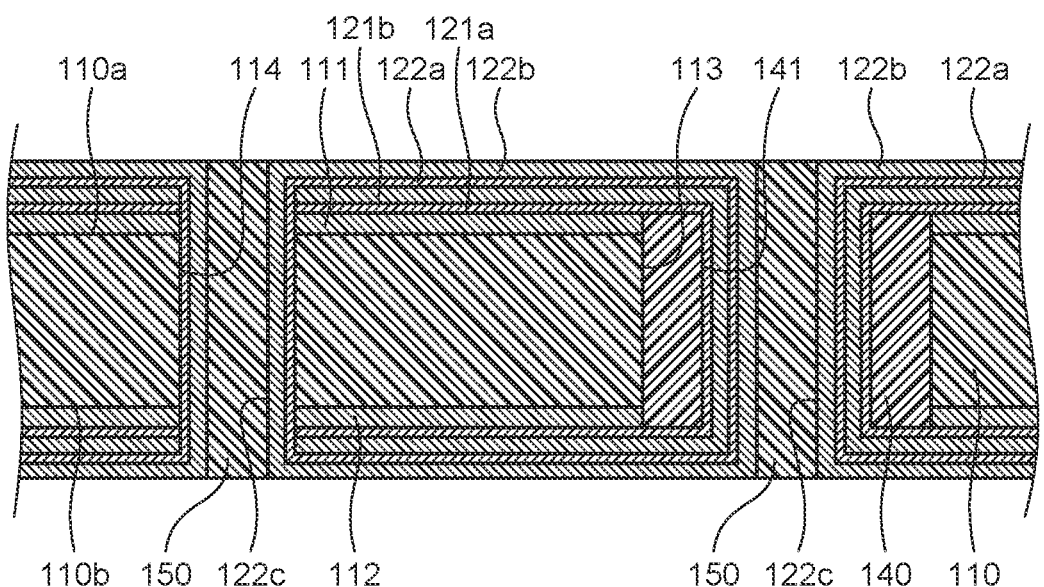
FIG. 14 is a diagram illustrating a specific example of a surface polishing process.

Thus, surface polishing is performed on the protruding portions such that the upper end portion and the lower end portion of the insulating resin 150 are flush with the surface of the second electrolytic plating film 122b (Step S111). Namely, for example, as illustrated in FIG. 14, the upper end portion of the insulating resin 150 is ground such that the upper surface of the second electrolytic plating film 122b and the upper surface of the insulating resin 150 are flush with each other, and the lower end portion of the insulating resin 150 is ground such that the lower surface of the second electrolytic plating film 122b and the lower surface of the insulating resin 150 are flush with each other. Furthermore, the resin residue remaining on the surface of the second electrolytic plating film 122b due to the polishing of the insulating resin 150 is removed by the desmear process.

Figure 15:
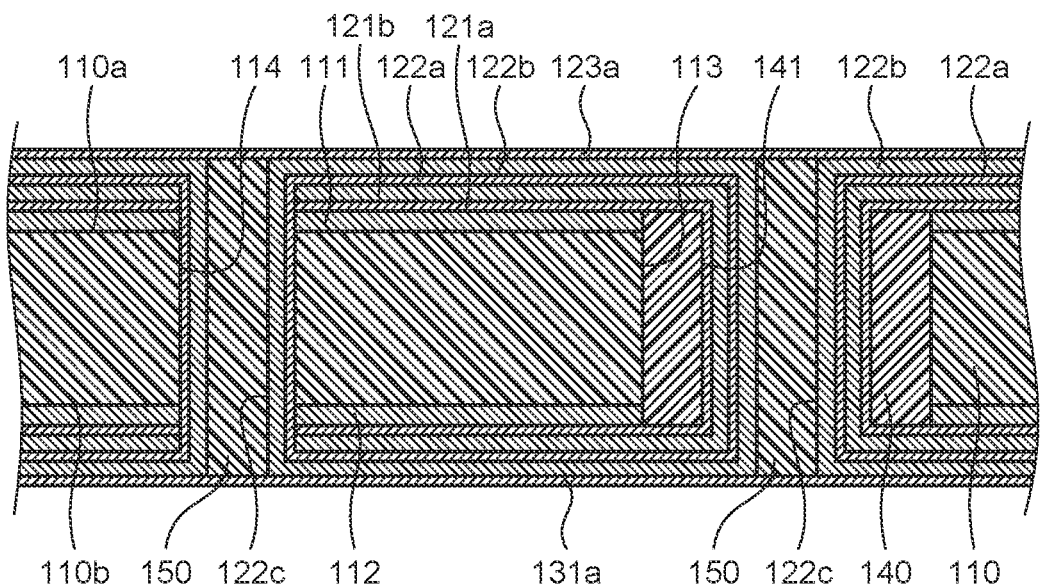
FIG. 15 is a diagram illustrating a specific example of a third and a fourth electroless copper plating processes.

Then, the third electroless plating film 123a and the fourth electroless plating film 131a that cover the portion exposed on the surface is formed (Step S112). Specifically, electroless copper plating is performed on the intermediate structure in which the insulating resin 150 is ground and the upper surface and the lower surface become plane surfaces, so that, for example, as illustrated in FIG. 15, the third electroless plating film 123a is formed on the upper surface of the intermediate structure, and the fourth electroless plating film 131a is formed on the lower surface of the intermediate structure. Here, because electroless copper plating is performed, the third electroless plating film 123a and the fourth electroless plating film 131a are also reliably formed on the upper surface and the lower surface of the insulating resin 150 that do not have conductivity. The thickness of each of the third electroless plating film 123a and the fourth electroless plating film 131a is about, for example, 0.4 to 0.6 µm.

Figure 16:
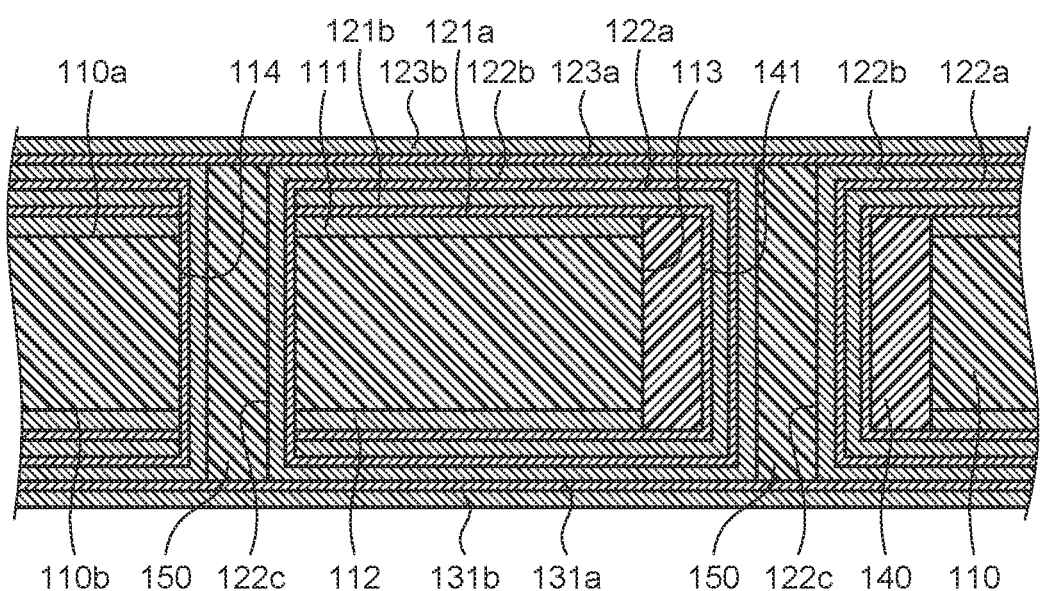
FIG. 16 is a diagram illustrating a specific example of the third and the fourth electrolytic copper plating processes.

Then, the third electrolytic plating film 123b and the fourth electrolytic plating film 131b are laminated on the third electroless plating film 123a and the fourth electroless plating film 131a (Step S113). Namely, because electrolytic copper plating is performed on the intermediate structure in which the third electroless plating film 123a and the fourth electroless plating film 131a are formed, for example, as illustrated in FIG. 16, the third electrolytic plating film 123b is laminated on the third electroless plating film 123a, and the fourth electrolytic plating film 131b is laminated on the fourth electroless plating film 131a. The thickness of each of the third electrolytic plating film 123b and the fourth electrolytic plating film 131b is about, for example, 13 to 17 µm.

Figure 17:
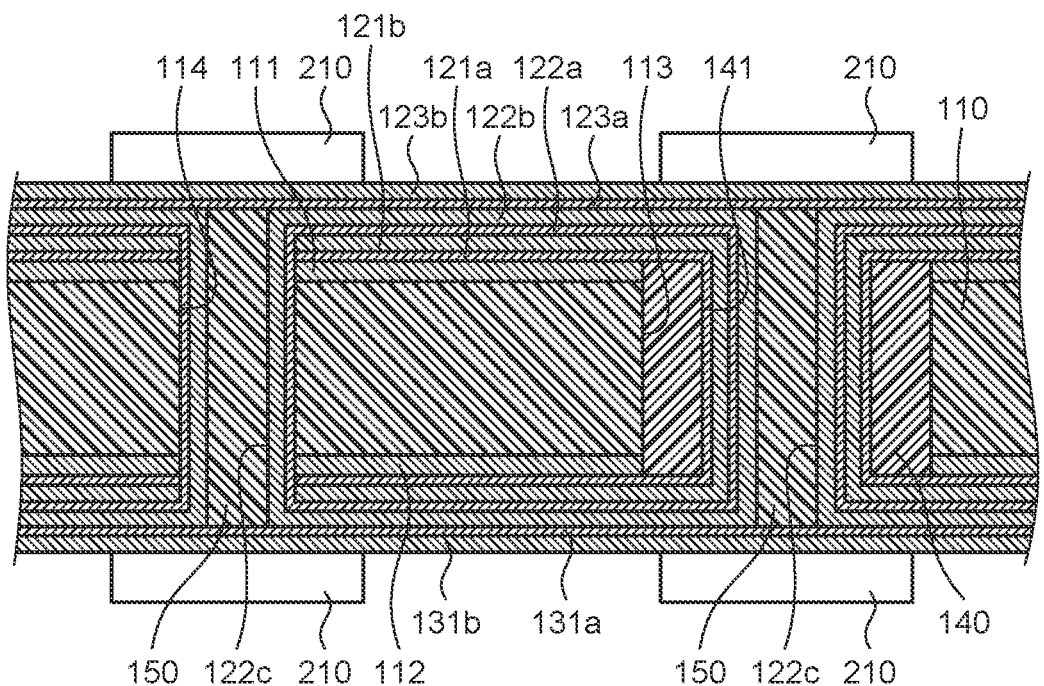
FIG. 17 is a diagram illustrating a specific example of forming etching resist.
Figure 18:
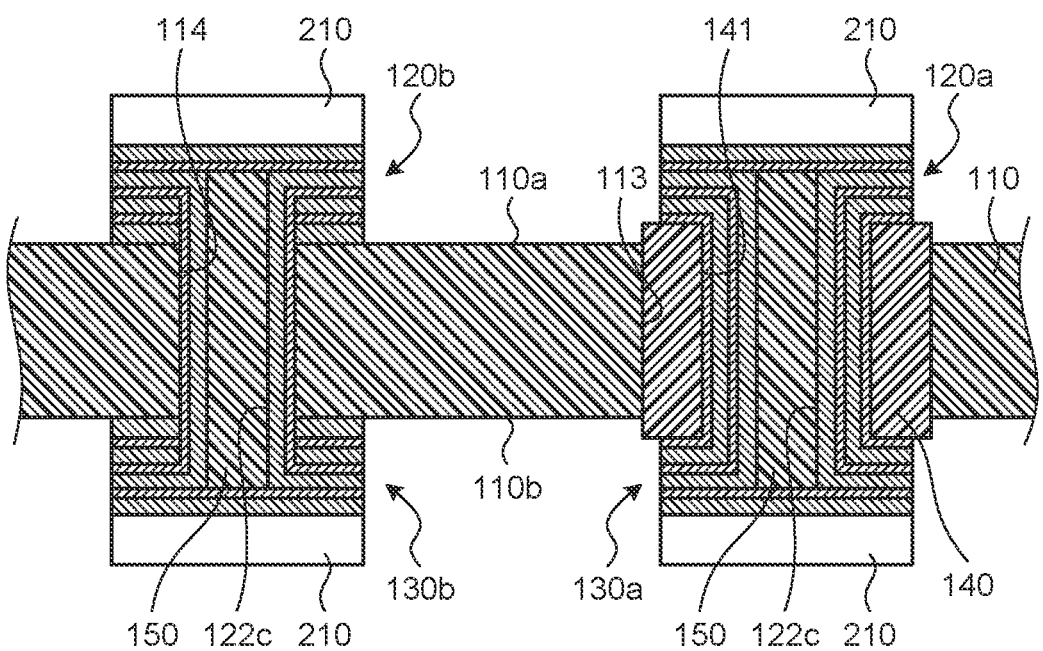
FIG. 18 is a diagram illustrating a specific example of an etching process.

All of the electroless plating films and the electrolytic plating films are formed as a result of the third electrolytic plating film 123b and the fourth electrolytic plating film 131b being formed, and then, etching is performed in order to form the wiring layers 120a, 120b, 130a, and 130b (Step S114). Namely, for example, as illustrated in FIG. 17, etching resists 210 are formed at the portions in each of which the plating film is left as wiring and a pad. FIG. 17 illustrates the etching resists 210 for forming a pad at the position of each of the through-hole 114 and the through-hole 141 in each of which the insulating resin ISO is filled. The diameter of the pad is larger than the diameter of the opening portion of the through-hole 114. Furthermore, the diameter of the pad is larger than the diameter of the opening portion of the through-hole 141 of the magnetic material 140 and is smaller than the diameter of the opening portion of the through-hole 113 in which the magnetic material 140 is filled. Therefore, the etching resist 210 having the size associated with the diameter of the pad is formed on the surface of each of the third electrolytic plating film 123b and the fourth electrolytic plating film 131b. The etching resists 210 have desired resolution and are formed of a material that is resistant to etching.

Then, the metal foils 111 and 112, the first electroless plating film 121a, the first electrolytic plating film 121b, the second electroless plating film 122a, the second electrolytic plating film 122b, the third electroless plating film 123a, the third electrolytic plating film 123b, the fourth electroless plating film 131a, and the fourth electrolytic plating film 131b are removed by being subjected to wet etching by using etching resists 210 as a masking material. Consequently, for example, as illustrated in FIG. 13, the wiring layers 120a and 120b each having a pad are formed on the upper surface 110a of the base material 110, and the wiring layers 130a and 130b each having a pad are formed on the lower surface 110b of the base material 110. The core substrate 100 is completed by removing the etching resists 210 from the wiring layers 120a, 120b, 130a, and 130b.

Figure 19:
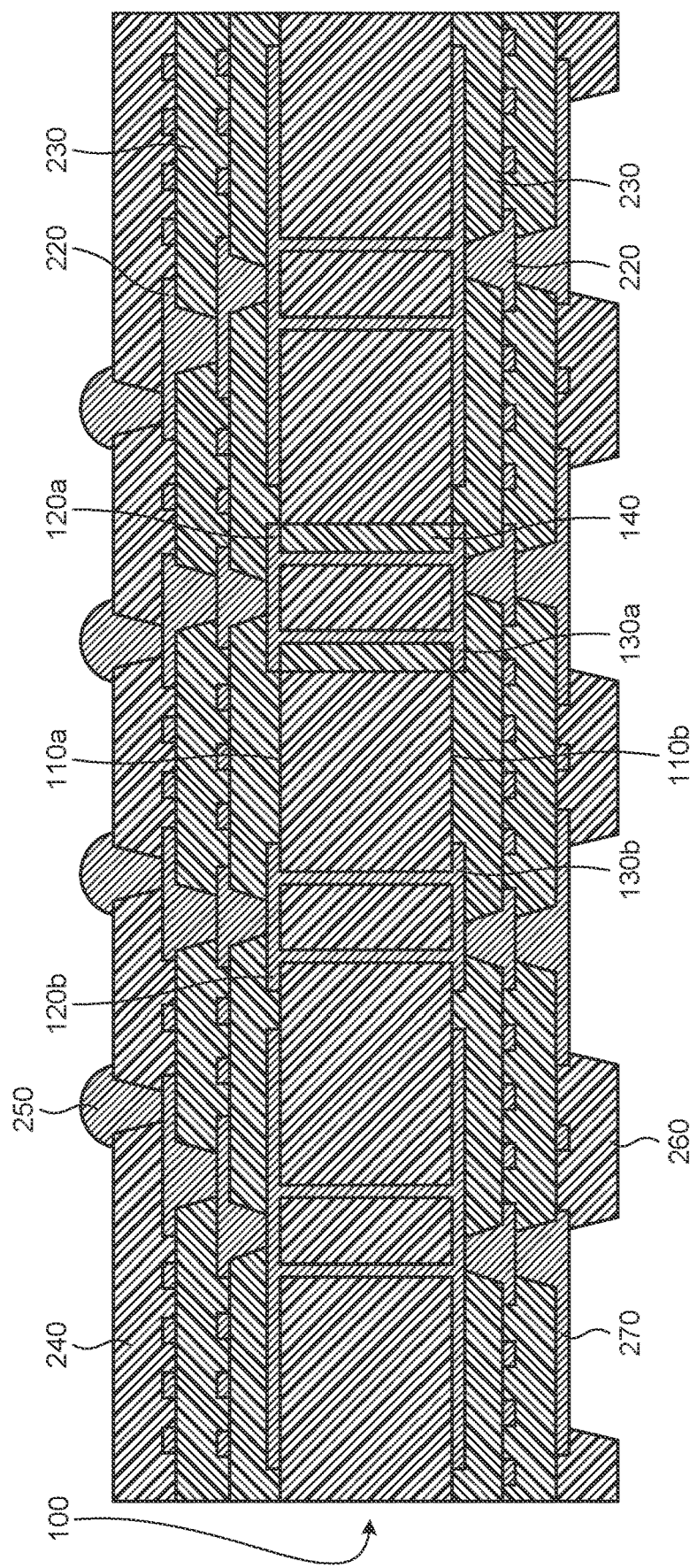
FIG. 19 is a diagram illustrating a configuration example of the multi-layer wiring substrate.

On the upper surface and the lower surface of the core substrate 100, the insulating layers and the wiring layers are sequentially build up, and then, the multi-layer wiring substrate is formed (Step S115). Specifically, for example, as illustrated in FIG. 19, an insulating layer 230 and a wiring layer 220 are laminated on each of the upper surface and the lower surface of the core substrate 100, and the wiring layer 220 that is the uppermost layer is covered by a solder mask layer 240. A through-hole is formed in the solder mask layer 240, a connecting terminal 250 that is made of solder or the like and that is used to electrically connect an electronic component, such as a semiconductor chip, to the wiring layer 220 is formed in this through-hole. In contrast, the wiring layer 220 that is the lowermost layer is covered by a solder mask layer 260. Then, an opening portion is formed on the solder mask layer 260, and an external connection pad 270 formed in the wiring layer 220 that is the lowermost layer is exposed from the opening portion. The external connection pad 270 can be electrically connected to external parts or devices. The insulating layers and the wiring layers may be formed by using, for example, a build-up process.

In this way, it is possible to form a multi-layer wiring substrate having the plurality of wiring layers 220 from the core substrate 100 having a built-in inductor using the magnetic material 140. This multi-layer wiring substrate can be used for a semiconductor device having mounted thereon a part, such as a semiconductor chip. Specifically, as illustrated in FIG. 20, a semiconductor chip 310 is mounted on the upper surface of the multi-layer wiring substrate. For example, the connecting terminal 250 on the multi-layer wiring substrate and an electrode 315, which is made of solder, of the semiconductor chip 310 are bonded. Then, the bonding portion between the connecting terminal 250 and the electrode 315 is sealed by an underfill resin 320, and the semiconductor device having mounted thereon the semiconductor chip 310 is obtained.

As described above, according to the embodiment, a through-hole is formed in the magnetic material that is filled in the base material, and then, after the first electroless plating film and the first electrolytic plating film are formed, another through-hole is formed at a portion other than the magnetic material to form the second electroless plating film and the second electrolytic plating film. Consequently, as compared to the other through-hole, a plating film having a thickness by an amount corresponding to the first electroless plating film and the first electrolytic plating film is formed inside the through-hole in the magnetic material; therefore, it is possible to reduce the electric resistance in the plating film inside the through-hole in the magnetic material, and it is thus possible to improve the electric characteristics of the inductor that is formed by the magnetic material and the plating film inside the through-hole.

According to an aspect of an embodiment of the wiring substrate and the method of manufacturing the wiring substrate disclosed in the present application, an advantage is provided in that it is possible to improve the electric characteristics of a built-in inductor.

With respect to the embodiments and the variety thereof described above, the following note is further disclosed.

(Note) A method of manufacturing a wiring substrate including:
  forming a first through-hole in a base material;
  filling a magnetic material in the first through-hole;
  forming a second through-hole in the magnetic material;
  forming a first plating film that covers an inner wall surface of the second through-hole;
  forming a third through-hole in the base material; and
  forming a second plating film that covers an inner wall surface of the third through-hole and the first plating film, wherein
  the forming the first plating film includes
    forming a first electroless plating film that is in contact with the inner wall surface of the second through-hole, and
    forming a first electrolytic plating film that is laminated on the first electroless plating film.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring substrate comprising:
  a base material;
  a first through-hole and a second through-hole that are formed in the base material;
  a magnetic material that is filled in the first through-hole;
  a third through-hole that is formed in the magnetic material;
  a first plating film that covers an inner wall surface of the third through-hole; and
  a second plating film that covers an inner wall surface of the second through-hole and the first plating film, wherein
  the first plating film includes
    a first electroless plating film that is in contact with the inner wall surface of the third through-hole, and
    a first electrolytic plating film that is laminated on the first electroless plating film inside the third through-hole and above a surface of the base material, the first electrolytic plating film being thinner inside the third through-hole than above the surface of the base material.

2. The wiring substrate according to claim 1, wherein the first plating film is formed spreading over a surface around an opening portion of both ends of the third through-hole, and
the second through-hole passes through the base material and passes through the first plating film that is formed spreading over the surface around the opening portion.

3. The wiring substrate according to claim 1, wherein the second plating film includes
  a second electroless plating film that is in contact with the inner wall surface of the second through-hole and the first electrolytic plating film, and
  a second electrolytic plating film that is laminated on the second electroless plating film.

4. The wiring substrate according to claim 1, further comprising:
  fourth through-holes that are formed inside the second plating film in the second through-hole and the third through-hole;
  an insulating resin that is filled in the fourth through-holes; and
  a third plating film that covers an end portion of the insulating resin at an opening portion of both ends of the fourth through-holes.

5. The wiring substrate according to claim 4, wherein the first plating film and the second plating film are formed spreading over a surface around the opening portion of the both ends of the fourth through-holes, and
the third plating film is laminated on the first plating film and the second plating film that are formed spreading over the surface around the opening portion.

6. The wiring substrate according to claim 5, wherein the third plating film includes
  a third electroless plating film that is in contact with the end portion of the insulating resin and the second plating film, and
  a third electrolytic plating film that is laminated on the third electroless plating film.

7. The wiring substrate according to claim 6, wherein the third electrolytic plating film is thicker than the first electrolytic plating film.

8. The wiring substrate according to claim 1, wherein the magnetic material is an insulation resin having magnetic particles.

9. The wiring substrate according to claim 1, wherein the first plating film and the second plating film form a wiring layer.

10. The wiring substrate according to claim 1, further comprising:
  an insulating layer that is laminated on the base material; and
  a wiring layer that is laminated on the insulating layer.

11. The wiring substrate according to claim 10, further comprising a semiconductor chip that is mounted on and connected to the wiring layer.

12. The wiring substrate according to claim 1, wherein the first electrolytic plating film is uniformly laminated on the first electroless plating film inside the third through-hole.

13. The wiring substrate according to claim 3, wherein the second electrolytic plating film is thicker than the first electrolytic plating film.

14. The wiring substrate according to claim 6, wherein the second plating film includes
  a second electroless plating film that is in contact with the inner wall surface of the second through-hole and the first electrolytic plating film, and
  a second electrolytic plating film that is laminated on the second electroless plating film, and
  the third electrolytic plating film is thinner than the second electrolytic plating film.

15. The wiring substrate according to claim 5, wherein the first plating film, the second plating film, and the third plating film form a wiring layer.

* * * * *